US008237328B2

(12) United States Patent
Kashiyama

(10) Patent No.: US 8,237,328 B2
(45) Date of Patent: Aug. 7, 2012

(54) FOREIGN SUBSTANCE REMOVING APPARATUS

(75) Inventor: Ritsuo Kashiyama, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 148 days.

(21) Appl. No.: 12/796,800

(22) Filed: Jun. 9, 2010

(65) Prior Publication Data

US 2010/0315711 A1 Dec. 16, 2010

(30) Foreign Application Priority Data

Jun. 15, 2009 (JP) ................................ 2009-142706

(51) Int. Cl.
*H01L 41/09* (2006.01)
*H02N 2/04* (2006.01)

(52) U.S. Cl. ....................................... 310/317; 310/328

(58) Field of Classification Search .................. 310/314, 310/317, 323.01–323.21, 328
See application file for complete search history.

(56) References Cited

U.S. PATENT DOCUMENTS

2006/0207290 A1 * 9/2006 Ide et al. ........................... 65/27

FOREIGN PATENT DOCUMENTS

JP 2007-267189 10/2007

* cited by examiner

*Primary Examiner* — Derek Rosenau
(74) *Attorney, Agent, or Firm* — Cowan, Liebowitz & Latman, P.C.

(57) ABSTRACT

A foreign substance removing apparatus that removes a foreign substance adhering on an optical member, comprising a piezoelectric element arranged at one end of the optical member, a transformer which generates a voltage to drive the piezoelectric element, the transformer including a primary-side wound wire and a secondary-side wound wire, the secondary-side wound wire being connected to the piezoelectric element, a first driving signal generation circuit which is connected to one end of the primary-side wound wire in the transformer, and generates a signal with a first frequency, and a second driving signal generation circuit which is connected to the other end of the primary-side wound wire in the transformer, and generates a signal with a second frequency.

8 Claims, 6 Drawing Sheets

FOREIGN SUBSTANCE REMOVING APPARATUS

BACKGROUND OF THE INVENTION

1. Field of the Invention

The present invention relates to a technique for removing a foreign substance adhered to an optical member of an image capturing apparatus such as a video camera or a digital still camera.

2. Description of the Related Art

In recent years, as the resolution of an optical sensor in an image capturing apparatus improves, dirt (foreign substance) which adheres to an optical system in use, adversely influences the captured image has become problematic. The resolutions of especially image capturing elements built in a video camera and a still camera are remarkably improving. For this reason, when external dust or a foreign substance such as abrasion powder produced by an internal mechanical sliding surface adheres to, for example, an infrared cutoff filter or an optical low-pass filter placed near an image capturing element, the following phenomenon often occurs. That is, the captured image may contain the foreign substance because the image capturing element has high resolution and an image on its surface blurs little.

When dust adheres to a member in an image capturing apparatus, the image quality is recovered as the user wipes away it. However, the user has no choice but to confirm dust, which has adhered to the apparatus in use, after image capturing. The image captured while dust adheres to the apparatus contains an image of the dust and therefore must be corrected using software.

Under the circumstance, a camera including a dust proof mechanism that exploits vibration has been commercialized. The dust proof mechanism that exploits vibration requires a considerable amount of vibration energy. To meet this requirement, Japanese Patent Laid-Open No. 2007-267189 discloses the following technique. A support member is positioned between a node of vibration in at least one vibration mode and that of vibration in another vibration mode, which have an interval between them, that is narrower than that between other two nodes, and a plurality of vibration modes are simultaneously generated in an optical member by an electromechanical energy conversion element. This removes dust adhering on the optical member while suppressing loss of vibration energy and reducing the energy consumption of a dust removing apparatus, and suppresses deterioration in optical characteristic due to heat generation.

A method of simultaneously generating a plurality of vibration modes, as disclosed in Japanese Patent Laid-Open No. 2007-267189, will be described with reference to a view of the arrangement of a dust removing apparatus built in a digital still camera, as shown in FIG. 7.

Referring to FIG. 7, a digital still camera includes an image capturing element package 14 including an image capturing element portion 14-1 and cover glass 14-2, and a dust removing apparatus. The dust removing apparatus includes piezoelectric elements, 2-1 and 2-2 which serve as vibrating bodies, a support member 61, a driving circuit 13, and an optical filter 51.

However, to generate a plurality of vibration modes, the conventional dust removing mechanism needs to drive piezoelectric elements serving as a plurality of electromechanical energy conversion elements at a plurality of driving frequencies. Hence, a plurality of driving circuits with different output frequencies are necessary. When a piezoelectric element is arranged on the optical filter 51, it needs to fall outside the image capturing region. Also, when a plurality of piezoelectric elements are used, the necessary area of an expensive optical filter increases. Furthermore, an increase in size of an optical filter often hinders downsizing of a camera.

SUMMARY OF THE INVENTION

The present invention has been made in consideration of the above-described problems, and reduces energy consumption in removing a foreign substance adhering on an optical member, and reduces the area of an expensive optical filter by decreasing the number of electromechanical energy conversion elements.

According to the present invention, there is provided a foreign substance removing apparatus that removes a foreign substance adhering on an optical member, comprising a piezoelectric element arranged at one end of the optical member; a transformer which generates a voltage to drive the piezoelectric element, the transformer including a primary-side wound wire and a secondary-side wound wire, the secondary-side wound wire being connected to the piezoelectric element; a first driving signal generation circuit which is connected to one end of the primary-side wound wire in the transformer, and generates a signal with a first frequency, and a second driving signal generation circuit which is connected to the other end of the primary-side wound wire in the transformer, and generates a signal with a second frequency.

Further features of the present invention will become apparent from the following description of exemplary embodiments with reference to the attached drawings.

DESCRIPTION OF THE EMBODIMENTS

Embodiments of the present invention will be described in detail below with reference to the accompanying drawings.

(First Embodiment)

Figure 1A:
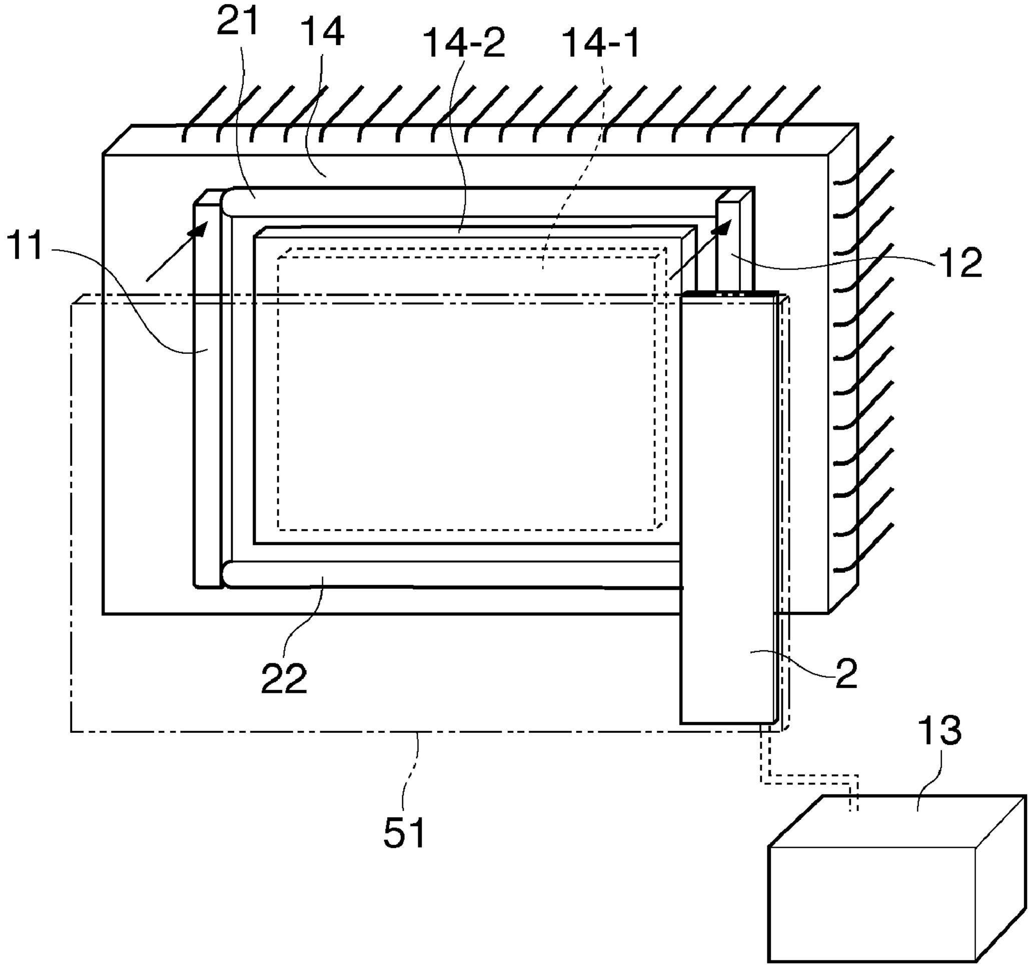
FIGS. 1A and 1B are views showing a dust removing apparatus built in a digital still camera serving as an image capturing apparatus according to the first embodiment of the present invention.
Figure 1B:
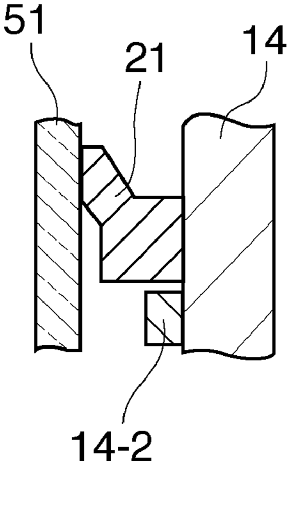

FIGS. 1A and 1B are views showing a dust removing apparatus (foreign substance removing apparatus) built in a digital still camera serving as an image capturing apparatus according to the first embodiment of the present invention. FIG. 1A is an exploded perspective view showing the arrangement of the dust removing apparatus. FIG. 1B is a sectional view showing a structure in which a sealing member connects an image capturing element package and an optical filter.

Referring to FIGS. 1A and 1B, a digital still camera includes an image capturing element package 14 including an image capturing element portion 14-1 and cover glass 14-2, and a dust removing apparatus (foreign substance removing apparatus). The dust removing apparatus includes a piezoelectric element 2, support members 11 and 12, a driving circuit 13, and an optical filter 51 (optical member).

In this embodiment, the optical filter 51 arranged in front of the image capturing element portion 14-1 is used as a vibrating member of the dust removing apparatus. The piezoelectric element 2 is bonded to one end of the optical filter 51 in the longitudinal direction. The driving circuit 13 applies an AC voltage (driving signal) on the piezoelectric element 2. The image capturing element package 14 has a structure in which the cover glass 14-2 seals the image capturing element portion 14-1.

The support members 11 and 12 are fixed between the image capturing element package 14 and the optical filter 51 using an adhesive material. The support members 11 and 12 relatively position the image capturing element package 14 and the optical filter 51, and support the optical filter 51. A sealing member 21 is connected to the support members 11 and 12 so as to connect their upper ends. A sealing member 22 is connected to the support members 11 and 12 so as to connect their lower ends. The sealing members 21 and 22 form an enclosed frame shape, together with the support members 11 and 12.

FIG. 1B enlarges the longitudinal sectional shape of the sealing member 21. The sealing member 22 has the same sectional shape as that of the sealing member 21, and is not shown. The contact surfaces of the sealing members 21 and 22 with the optical filter 51 are formed to have a width smaller than that of the contact surfaces of the sealing members 21 and 22 with the image capturing element package 14. The sealing members 21 and 22 have lip-shaped longitudinal sections.

As described above, the support members 11 and 12 are fixed to the image capturing element package 14 and optical filter 51 using an adhesive material. Hence, the support members 11 and 12 and sealing members 21 and 22 can form an enclosed space between the image capturing element package 14 and the optical filter 51. This makes it possible to prevent external dust (foreign substance) from entering between the image capturing element package 14 and the optical filter 51.

Figure 2:
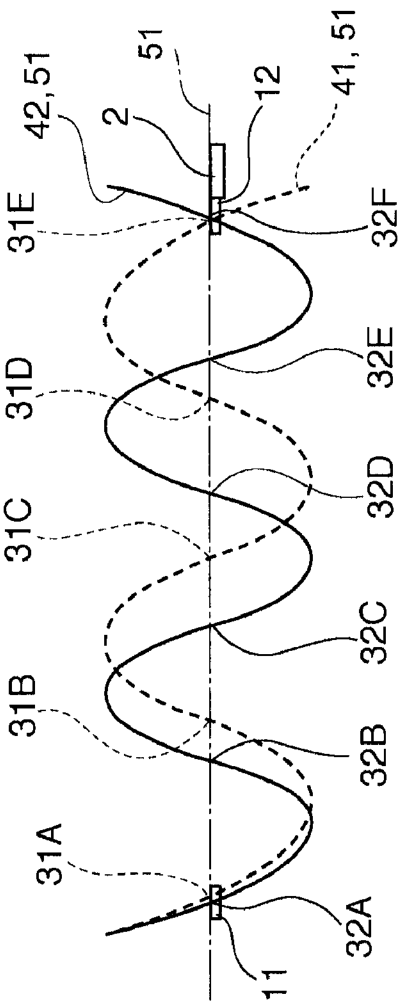
FIG. 2 is a graph showing the vibration shapes of vibration modes generated by the dust removing apparatus shown in FIGS. 1A and 1B.

FIG. 2 is a graph showing the vibration shapes of vibration modes generated by the dust removing apparatus. FIG. 2 shows the positional relationships between the support members 11 and 12 and the vibration shapes of vibration modes generated in the optical filter 51 by the piezoelectric element 2. In this embodiment, the fourth-order bending vibration mode is defined as a first vibration mode, and the fifth-order bending vibration mode is defined as a second vibration mode. That is, the first vibration mode and second vibration mode are out-of-plane vibration modes in which the optical filter 51 undergoes bending deformation in the direction of thickness. Vibrations in the first vibration mode and second vibration mode simultaneously or sequentially act on the optical filter 51.

Of the intervals between five nodes (31A, 31B, 31C, 31D, 31E) of vibration in the first vibration mode 41 and six nodes (32A, 32B, 32C, 32D, 32E, 32F) of vibration in the second vibration mode 42, the interval is widest between nodes 31C and 32C and between the node 31C and a node 32D in the vicinity of the center. The interval is narrowest between nodes 31A and 32A and between nodes 31E and 32F on the two edges.

In this embodiment, the support members 11 and 12 are positioned between the nodes 31A and 32A and the nodes 31E and 32F, respectively, on the two edges, both of which have a narrowest interval in the first and second vibration modes. The support members 11 and 12 are made of an elastic member that has a rigidity high enough to control the gap between the optical filter 51 and the image capturing element package 14 but has a flexibility high enough not to inhibit vibration. The support members 11 and 12 are set at the above-mentioned positions to prevent vibration acting on the optical filter 51 from being inhibited.

Since the above-mentioned support members 11 and 12 support the optical filter 51, the sealing members 21 and 22 need only have a sealing function. This makes it possible to form the sealing members 21 and 22 to have a given flexibility and a small contact area with the optical filter 51. Hence, vibration acting on the optical filter 51 is hard to inhibit even when the sealing members 21 and 22 are set at a plurality of antinode positions of vibrations in the first and second vibration modes. This makes it possible to effectively remove dust adhering on the optical filter 51 by vibration.

Figure 3:
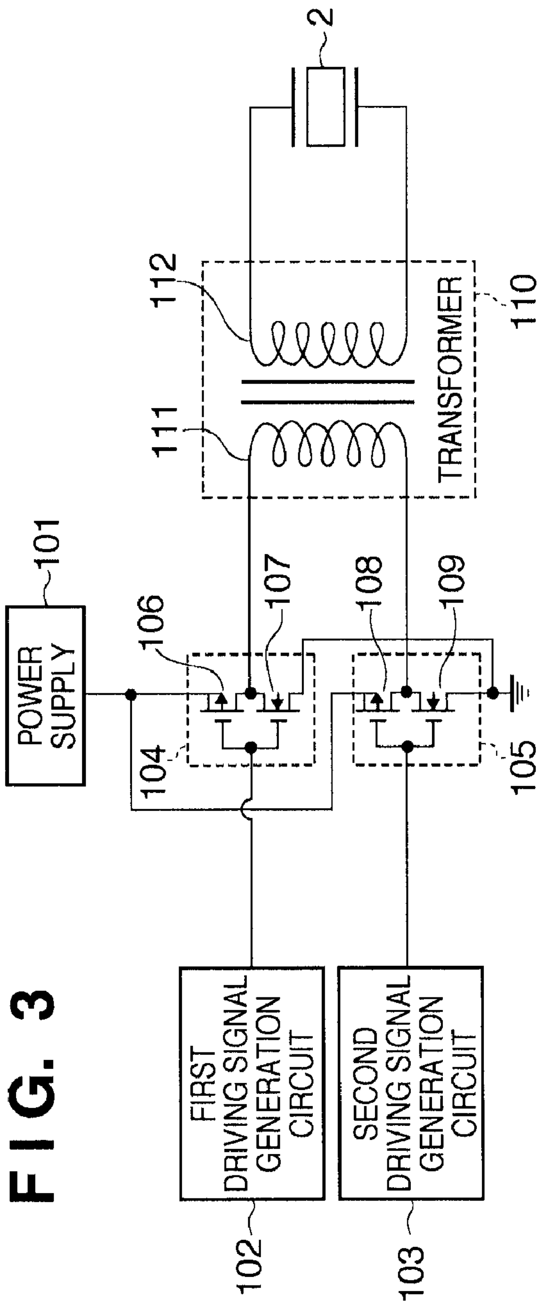
FIG. 3 is a circuit diagram showing the configuration of an electrical circuit in the dust removing apparatus according to the first embodiment.

FIG. 3 is a circuit diagram showing the configuration of an electrical circuit for driving the dust removing apparatus according to this embodiment. Referring to FIG. 3, a power supply 101 serves to drive the piezoelectric element 2. When the dust removing apparatus is built in a camera, the power supply 101 also serves to drive the entire camera. A first driving signal generation circuit 102 generates a signal with a first frequency to generate a first vibration mode of a plurality of vibration modes generated in the piezoelectric element 2. A second driving signal generation circuit 103 generates a signal with a second frequency to generate a second vibration mode of a plurality of vibration modes generated in the piezoelectric element 2. The first and second driving signal generation circuits 102 and 103 simultaneously generate frequency signals each corresponding to one of necessary vibration modes. Also, these frequency signals have different frequencies to respectively generate different vibrations, and the respective frequencies can be swept. The frequency signals output from the first and second driving signal generation circuits 102 and 103 are rectangular waves.

A first driving circuit 104 drives one end of a primary-side wound wire 111 in a transformer 110 using the power supply 101 under the control of the driving signal generated by the first driving signal generation circuit 102. Also, a second driving circuit 105 drives the other end of the primary-side wound wire 111 in the transformer 110 using the power supply 101 under the control of the driving signal generated by the second driving signal generation circuit 103. P-ch MOSFETs 106 and 108 serve as a first positive-side switching element and second positive-side switching element, respectively, which constitute the first and second driving circuits 104 and 105.

The P-ch MOSFET 106 has its source connected to the power supply 101, its drain connected to one end of the primary-side wound wire 111 in the transformer 110, and its gate connected to the output of the first driving signal generation circuit 102. The P-ch MOSFET 108 has its source connected to the power supply 101, its drain connected to the other end of the primary-side wound wire 111 in the transformer 110, and its gate connected to the output of the second driving signal generation circuit 103.

N-ch MOSFETs 107 and 109 serve as a first negative-side switching element and second negative-side switching element, respectively, which constitute the first and second driving circuits 104 and 105. The N-ch MOSFET 107 has its source connected to the ground, its drain connected to one end of the primary-side wound wire 111 in the transformer 110, and its gate connected to the output of the first driving signal generation circuit 102. The N-ch MOSFET 109 has its source connected to the ground, its drain connected to the other end of the primary-side wound wire 111 in the transformer 110, and its gate connected to the output of the second driving signal generation circuit 103. A combination of the P-ch MOSFET 106 and the N-ch MOSFET 107 forms the first driving circuit 104. A combination of the P-ch MOSFET 108 and the N-ch MOSFET 109 forms the second driving circuit 105.

A secondary-side wound wire 112 in the transformer 110 is connected to the piezoelectric element 2, and generates a voltage by magnetic coupling in response to a change in current flowing through the primary-side wound wire 111 in the transformer 110 to apply a driving voltage to the piezoelectric element 2.

Figure 4:
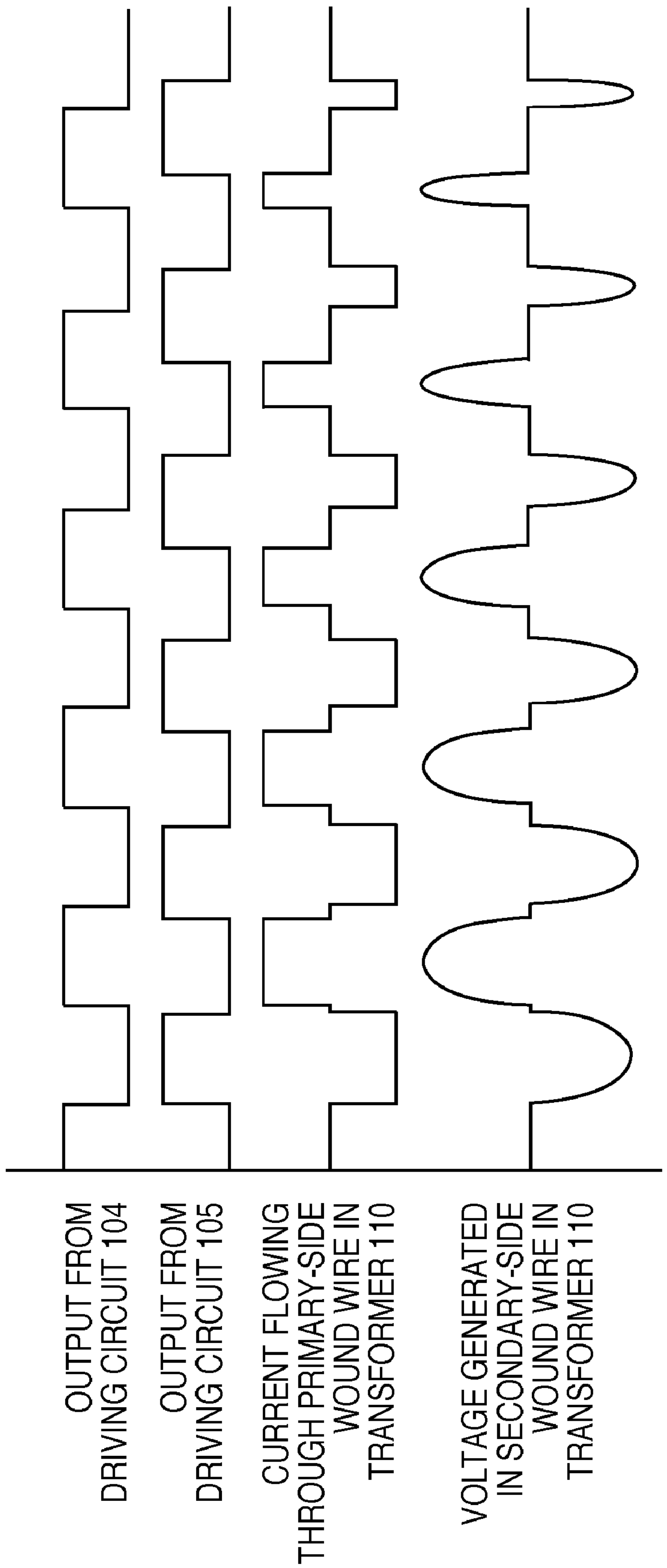
FIG. 4 is a chart showing the waveforms of electrical signals in the dust removing apparatus according to the first embodiment.

FIG. 4 is a chart showing the states of signals from an electrical circuit for driving the dust removing apparatus according to this embodiment. More specifically, FIG. 4 shows an output from the first driving circuit 104, an output from the second driving circuit 105, a current flowing through the primary-side wound wire 111 in the transformer 110, and a voltage generated in the secondary-side wound wire 112 in the transformer 110. Note that the voltage generated in the secondary-side wound wire 112 is a sinusoidal voltage generated by the capacitance component of the piezoelectric element 2 and the inductance component of the secondary-side wound wire 112 in the transformer 110. Also, the voltage generated in the secondary-side wound wire 112 of the transformer 110 is boosted to a level appropriate to drive the piezoelectric element 2 in accordance with the turns ratio between the primary-side wound wire 111 and secondary-side wound wire 112 in the transformer 110.

Furthermore, the voltage generated in the secondary-side wound wire 112 in the transformer 110 has a waveform obtained by synthesizing the output frequencies of the first driving circuit 104 and second driving circuit 105. In other words, this voltage is a synthetic signal containing two frequency signal components of the frequency signals output from both the first driving signal generation circuit 102 and the second driving signal generation circuit 103.

A plurality of vibrations in the first and second vibration modes can be generated in the piezoelectric element 2 by driving it using the obtained synthetic signal.

As described above, according to the first embodiment, it is possible to simultaneously generate a plurality of nodes in one piezoelectric element 2. This makes it possible to decrease the number of necessary piezoelectric elements and reduce the area of an expensive optical filter, thus reducing the cost and size of the dust removing apparatus.

(Second Embodiment)

In the above-mentioned first embodiment, two frequency signals are synthesized by driving one end and the other end of a primary-side wound wire in a transformer in accordance with outputs from driving circuits with different frequencies. In contrast to this, a primary-side wound wire in a transformer is divided into two parts in the second embodiment to be described hereinafter.

The appearance of a dust removing apparatus built in a digital still camera in the second embodiment is the same as that shown in FIGS. 1A, 1B, and 2 described in the first embodiment, and a description thereof will not be given.

Figure 5:
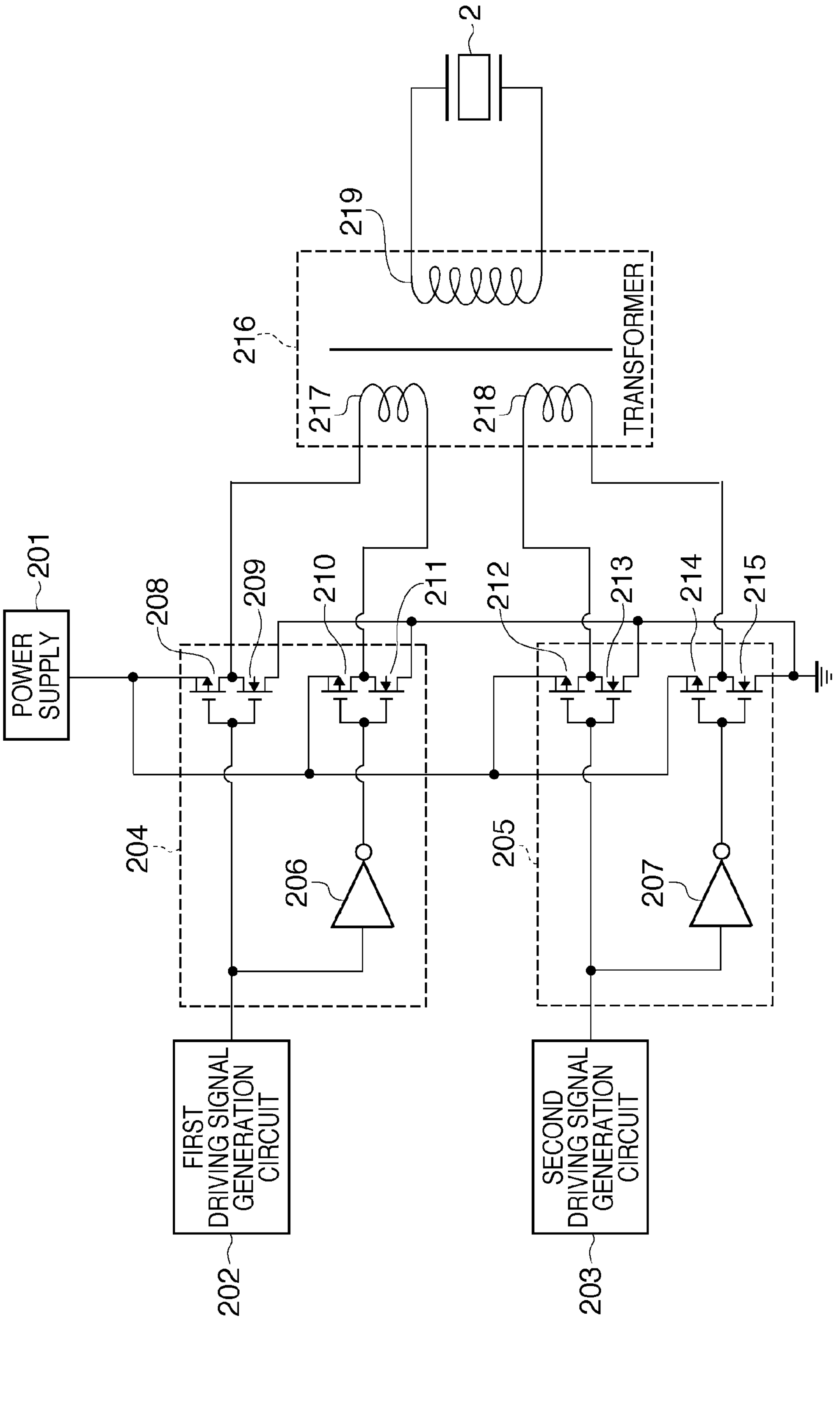
FIG. 5 is a circuit diagram showing the configuration of an electrical circuit in a dust removing apparatus according to the second embodiment.

FIG. 5 is a circuit diagram showing the circuit configuration of an electrical circuit for driving the dust removing apparatus according to this embodiment. Referring to FIG. 5, a power supply 201 serves to drive a piezoelectric element 2. When the dust removing apparatus is built in a camera, the power supply 201 also serves to drive the entire camera. A first driving signal generation circuit 202 generates a signal with a first frequency to generate a first vibration mode of a plurality of vibration modes generated in the piezoelectric element 2. A second driving signal generation circuit 203 generates a signal with a second frequency to generate a second vibration mode of a plurality of vibration modes generated in the piezoelectric element 2. The first and second driving signal generation circuits 202 and 203 simultaneously generate frequency signals each corresponding to one of necessary vibration modes. Also, these frequency signals have different frequencies to respectively generate different vibrations, and the respective frequencies can be swept. The frequency signals output from the first and second driving signal generation circuits 202 and 203 are rectangular waves.

A first driving circuit 204 drives a first primary-side wound wire 217 in a transformer 216 using the power supply 201 under the control of the driving signal generated by the first driving signal generation circuit 202. Also, a second driving circuit 205 drives a second primary-side wound wire 218 in the transformer 216 using the power supply 201 under the control of the driving signal generated by the second driving signal generation circuit 203. Inverters 206 and 207 (a first inverter and a second inverter) invert the signals from the first and second driving signal generation circuits 202 and 203, respectively. P-ch MOSFETs 208, 210, 212, and 214 serve as first to fourth positive-side switching elements, respectively, which constitute the first driving circuits 204 and 205.

The P-ch MOSFET 208 (first positive-side switching element) has its source connected to the power supply 201, its drain connected to one end of the first primary-side wound wire 217 in the transformer 216, and its gate connected to the output of the first driving signal generation circuit 202. The P-ch MOSFET 210 (second positive-side switching element) has its source connected to the power supply 201, its drain connected to the other end of the first primary-side wound wire 217 in the transformer 216, and its gate connected to the inverter 206. The P-ch MOSFET 212 (third positive-side switching element) has its source connected to the power supply 201, its drain connected to one end of the second primary-side wound wire 218 in the transformer 216, and its gate connected to the output of the second driving signal generation circuit 203. The P-ch MOSFET 214 (fourth positive-side switching element) has its source connected to the power supply 201, its drain connected to the other end of the second primary-side wound wire 218 in the transformer 216, and its gate connected to the inverter 207.

N-ch MOSFETs 209, 211, 213, and 215 serve as first to fourth negative-side switching elements, respectively, which constitute the first and second driving circuits 204 and 205. The N-ch MOSFET 209 (first negative-side switching element) has its source connected to the ground, its drain connected to one end of the first primary-side wound wire 217 in the transformer 216, and its gate connected to the output of the first driving signal generation circuit 202. The N-ch MOSFET 211 (second negative-side switching element) has its source connected to the ground, its drain connected to the other end of the first primary-side wound wire 217 in the transformer 216, and its gate connected to the inverter 206. The N-ch MOSFET 213 (third negative-side switching element) has its source connected to the ground, its drain connected to one end of the second primary-side wound wire 218 in the transformer 216, and its gate connected to the output of the second driving signal generation circuit 203. The N-ch MOSFET 215 (fourth negative-side switching element) has its source connected to the ground, its drain connected to the other end of the second primary-side wound wire 218 in the transformer 216, and its gate connected to the inverter 207.

A combination of the P-ch MOSFETs 208 and 210 and the N-ch MOSFETs 209 and 211 forms the first driving circuit 204. A combination of the P-ch MOSFETs 212 and 214 and the N-ch MOSFETs 213 and 215 forms the second driving circuit 205.

A secondary-side wound wire 219 in the transformer 216 is connected to the piezoelectric element 2, and generates a voltage by magnetic coupling in response to changes in currents flowing through the first primary-side wound wire 217 and second primary-side wound wire 218 in the transformer 216 to apply a driving voltage to the piezoelectric element 2.

Figure 6:
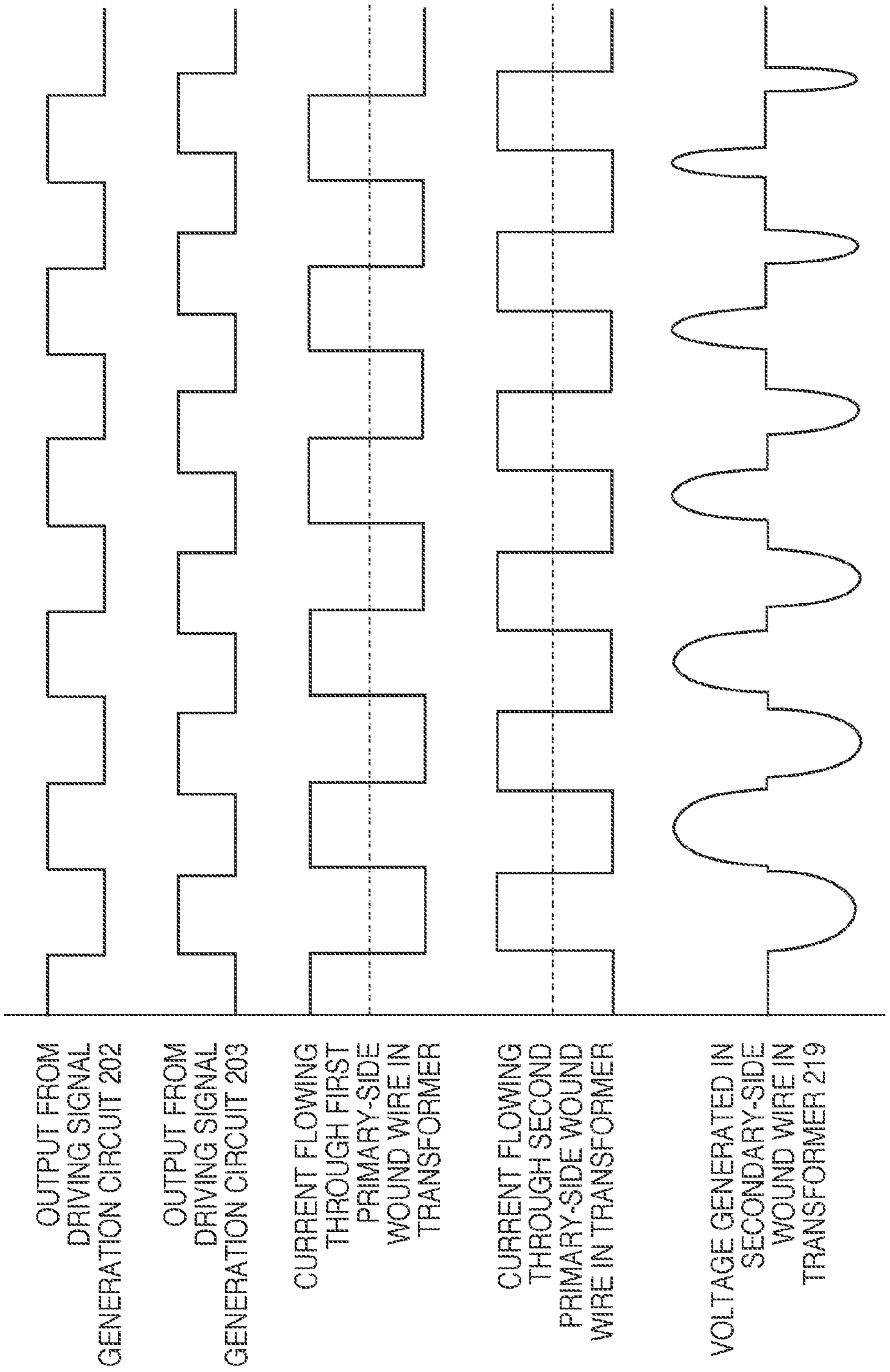
FIG. 6 is a chart showing the waveforms of electrical signals in the dust removing apparatus according to the second embodiment.
Figure 7:
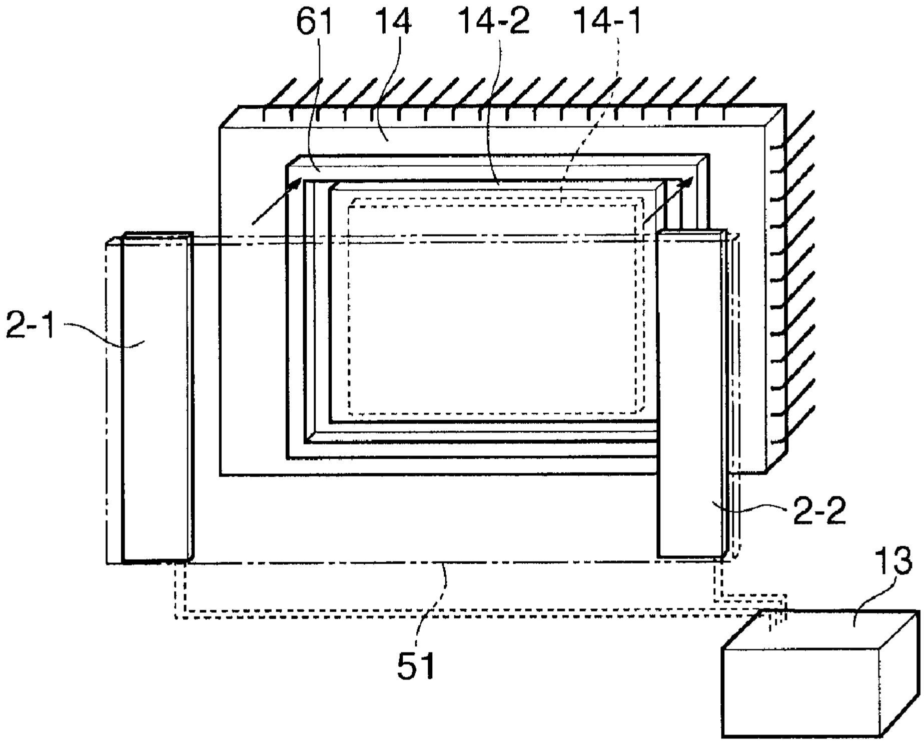
FIG. 7 (PRIOR ART)
FIG. 7 is a view showing a conventional dust removing apparatus built in a digital still camera.

FIG. 6 is a chart showing the states of signals from an electrical circuit for driving the dust removing apparatus according to this embodiment. More specifically, FIG. 6 shows an output from the first driving signal generation circuit 202, an output from the second driving signal generation circuit 203, a current flowing through the first primary-side wound wire 217 in the transformer 216, a current flowing through the second primary-side wound wire 218 in the transformer 216, and a voltage generated in the secondary-side wound wire 219 in the transformer 216. Note that the voltage generated in the secondary-side wound wire 219 is a sinusoidal voltage generated by the capacitance component of the piezoelectric element 2 and the inductance component of the secondary-side wound wire 219 in the transformer 216. Also, the voltage generated in the secondary-side wound wire 219 of the transformer 216 is boosted to a level appropriate to drive the piezoelectric element 2 in accordance with the turns ratios between the primary-side wound wires 217 and 218 and secondary-side wound wire 219 in the transformer 216.

Furthermore, the voltage generated in the secondary-side wound wire 219 in the transformer 216 has a waveform obtained by synthesizing the output frequencies of the first driving signal generation circuit 202 and second driving signal generation circuit 203, that is, is a synthetic signal containing two frequency signal components. A plurality of vibrations in the first and second vibration modes can be generated in the piezoelectric element 2 by driving it using the obtained synthetic signal.

As described above, according to the second embodiment, it is possible to simultaneously generate a plurality of nodes in one piezoelectric element 2. This makes it possible to decrease the number of necessary piezoelectric elements and reduce the area of an expensive optical filter, thus reducing the cost and size of the dust removing apparatus.

Although a case in which a dust removing apparatus is applied to a digital still camera has been exemplified in each of the above-mentioned first and second embodiments, the present invention is not limited to this. A dust removing apparatus is applicable not only to a digital still camera but also to various types of devices such as a copying machine, a facsimile machine, a scanner, and a video camera.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-142706, filed Jun. 15, 2009, which is hereby incorporated by reference herein in its entirety.

What is claimed is:

1. A foreign substance removing apparatus that removes a foreign substance adhering on an optical member, comprising:

a piezoelectric element arranged at one end of the optical member;

a transformer which generates a voltage to drive the piezoelectric element, the transformer including a primary-side wound wire and a secondary-side wound wire, the secondary-side wound wire being connected to the piezoelectric element;

a first driving signal generation circuit which generates a first driving signal with a first frequency;

a first driving circuit which is connected to one end of the primary-side wound wire in the transformer, and drives one end of the primary-side wound wire in the transformer under the control of the first driving signal generated by the first driving signal generation circuit;

a second driving signal generation circuit which generates a second driving signal with a second frequency; and a second driving circuit which is connected to the other end of the primary-side wound wire in the transformer, and drives the other end of the primary-side wound wire in the transformer under the control of the second driving signal generated by the second driving signal generation circuit;

wherein the first frequency of the first driving signal and the second frequency of the second driving signal are different from each other.

2. The apparatus according to claim 1, wherein the signal with the first frequency and the signal with the second frequency are rectangular waves.

3. The apparatus according to claim 1, wherein the first driving circuit including a first positive-side switching element having a source connected to a power supply, a drain connected to the one end of the primary-side wound wire in the transformer, and a gate connected to the first driving signal generation circuit, and a first negative-side switching element having a source connected to a ground, a drain connected to the one end of the primary-side wound wire in the transformer, and a gate connected to the first driving signal generation circuit, and wherein the second driving circuit including a second positive-side switching element having a source connected to the power supply, a drain connected to the other end of the primary-side wound wire in the transformer, and a gate connected to the second driving signal generation circuit, and a second negative-side switching element having a source connected to the ground, a drain connected to the other end of the primary-side wound wire in the transformer, and a gate connected to the second driving signal generation circuit.

4. The apparatus according to claim 1, wherein the first driving signal generation circuit and the second driving signal generation circuit simultaneously generate frequency signals.

5. A foreign substance removing apparatus which removes a foreign substance adhering on an optical member, comprising:

a piezoelectric element arranged at one end of the optical member;

a transformer which generates a voltage to drive the piezoelectric element, the transformer including a first primary-side wound wire, a second primary-side wound wire, and a secondary-side wound wire, the secondary-side wound wire being connected to the piezoelectric element;

a first driving signal generation circuit which generates a signal with a first frequency;

a first driving circuit which is connected to the first primary-side wound wire in the transformer, and drives the first primary-side wound wire in the transformer under the control of the first driving signal generated by the first driving signal generation circuit;

a second driving signal generation circuit which generates a signal with a second frequency; and a second driving circuit which is connected to the second primary-side wound wire in the transformer, and drives the second primary-side wound wire in the transformer under the control of the second driving signal generated by the second driving signal generation circuit;

wherein the first frequency of the first driving signal and the second frequency of the second driving signal are different from each other.

6. The apparatus according to claim 5, wherein the signal with the first frequency and the signal with the second frequency are rectangular waves.

7. The apparatus according to claim 5:

wherein the first driving circuit including a first positive-side switching element having a source connected to a power supply, a drain connected to one end of the first primary-side wound wire in the transformer, and a gate connected to the first driving signal generation circuit, a first negative-side switching element having a source connected to a ground, a drain connected to the one end of the first primary-side wound wire in the transformer, and a gate connected to the first driving signal generation circuit, a first inverter which inverts the output from the first driving signal generation circuit, a second positive-side switching element having a source connected to the power supply, a drain connected to the other end of the first primary-side wound wire in the transformer, and a gate connected to the first inverter, and a second negative-side switching element having a source connected to the ground, a drain connected to the other end of the first primary-side wound wire in the transformer, and a gate connected to the first inverter; and wherein the second driving circuit including a third positive-side switching element having a source connected to the power supply, a drain connected to one end of the second primary-side wound wire in the transformer, and a gate connected to the second driving signal generation circuit, a third negative-side switching element having a source connected to the ground, a drain connected to the one end of the second primary-side wound wire in the transformer, and a gate connected to the second driving signal generation circuit, a second inverter which inverts the output from the second driving signal generation circuit, a fourth positive-side switching element having a source connected to the power supply, a drain connected to the other end of the second primary-side wound wire in the transformer, and a gate connected to the second inverter, and a fourth negative-side switching element having a source connected to the ground, a drain connected to the other end of the second primary-side wound wire in the transformer, and a gate connected to the second inverter.

8. The apparatus according to claim 5, wherein the first driving signal generation circuit and the second driving signal generation circuit simultaneously generate frequency signals which generate different vibration modes.

* * * * *